United States Patent
Duong

(10) Patent No.: US 7,139,691 B1
(45) Date of Patent: Nov. 21, 2006

(54) METHOD FOR CALCULATING WEIGHTED AVERAGE GROUND BOUNCE NOISE GENERATED BY SIMULTANEOUS SWITCHING OUTPUTS IN A DIGITAL SYSTEM

(75) Inventor: Anthony T. Duong, Saratoga, CA (US)

(73) Assignee: Xilinx, Inc., San Jose, CA (US)

( * ) Notice: Subject to any disclaimer, the term of this patent is extended or adjusted under 35 U.S.C. 154(b) by 570 days.

(21) Appl. No.: 10/691,151

(22) Filed: Oct. 21, 2003

(51) Int. Cl.
*G06F 17/50* (2006.01)

(52) U.S. Cl. ............................................. 703/19; 326/82
(58) Field of Classification Search ................. 703/19, 703/14; 326/26, 82, 31; 707/107; 714/47; 716/5
See application file for complete search history.

(56) References Cited

U.S. PATENT DOCUMENTS

| | | | | |
|---|---|---|---|---|
| 5,160,922 A | * | 11/1992 | DeRosa et al. ............ 710/107 |
| 5,477,460 A | * | 12/1995 | Vakirtzis et al. ............... 716/5 |
| 5,838,204 A | * | 11/1998 | Yao ............................ 331/1 R |
| 6,864,644 B1 | * | 3/2005 | Kernahan .................... 315/307 |
| 7,043,670 B1 | * | 5/2006 | Alani et al. .................... 714/47 |

* cited by examiner

*Primary Examiner*—Albert W. Paladini
(74) *Attorney, Agent, or Firm*—Scott Hewett

(57) ABSTRACT

Ground bounce noise in a digital system is evaluated using a weighted average simultaneous switching output ("WASSO") on an I/O bank of a digital switching device, such as a field programmable gate array ("FPGA"). The WASSO allows a designer to normalize output drivers having different characteristics on a single I/O bank. In a further embodiment, a simultaneous switching output allowance ("SSO allowance") is calculated using scaling factors derived from values assumed in the creation of published SSO information and predicted actual values of the device in a digital system that are not represented in tables of published SSO guidelines. The SSO allowance is used in conjunction with WASSO values of adjacent I/O banks to evaluate ground bounce for adjacent I/O banks.

22 Claims, 5 Drawing Sheets

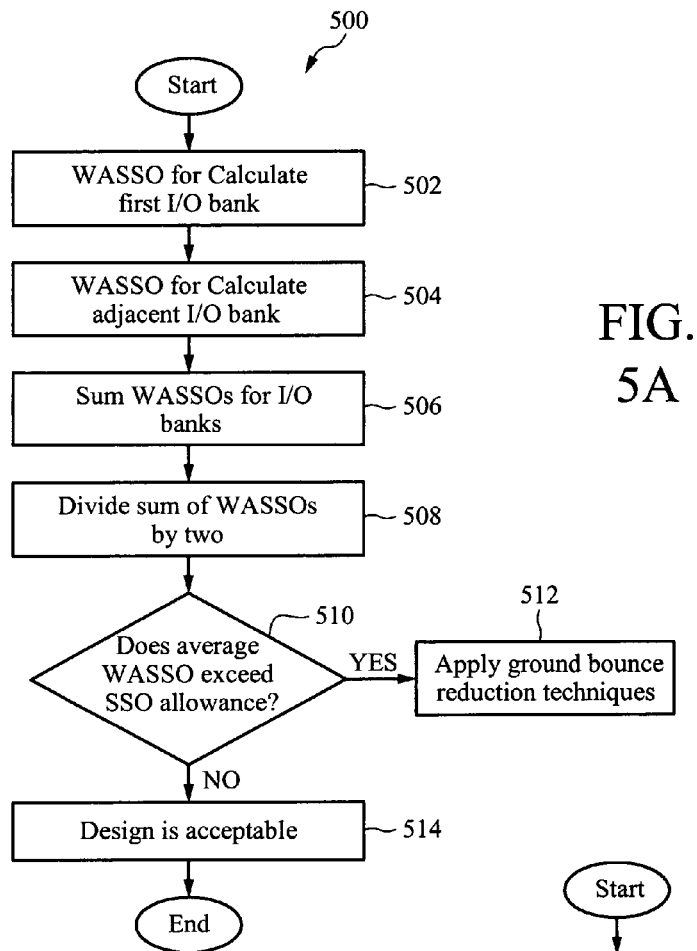
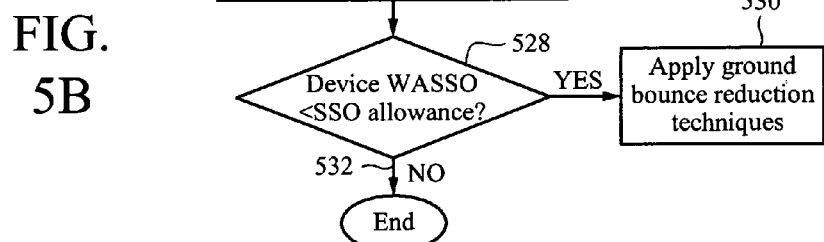
FIG. 5A
FIG. 5B

FIG. 6

METHOD FOR CALCULATING WEIGHTED AVERAGE GROUND BOUNCE NOISE GENERATED BY SIMULTANEOUS SWITCHING OUTPUTS IN A DIGITAL SYSTEM

FIELD OF THE INVENTION

This invention relates generally to digital logic devices, and more particularly to a method for calculating noise generated by simultaneous switching outputs in a digital device, such as a field-programmable gate array ("FPGA").

BACKGROUND OF THE INVENTION

Ground bounce can occur with high-speed digital integrated circuits ("ICs") when multiple outputs change states simultaneously. Ground bounce can cause several undesired effects, both on the output of the switching device and on the receiving logic device. In order to avoid problems associated with ground bounce, manufacturers of ICs publish tables of guidelines for the maximum number of simultaneous switching outputs ("SSOs") that each power/ground pair (driver) of an IC can provide without violating a specified ground bounce limit.

Ground bounce is primarily due to current changes in the combined inductance from ground pins, bond wires, and ground metallization. The internal ground level of the IC deviates from the external system ground level for a short duration (typically a few nanoseconds) after multiple outputs change state simultaneously.

The switching output is supposed to provide a logical "1" or logical "0". Ground bounce can affect whether the switching output is properly read by receiving logic because the logical state is typically derived by comparing an incoming signal to the internal ground of the switching device. Noise on the signal and/or ground can alter the logical state read by the receiving logic and cause erroneous operation of the system if the ground bounce amplitude exceeds the instantaneous noise margin. For example, ground bounce noise on a non-changing input that raises the internal ground level above the instantaneous noise margin might unintentionally toggle the logical state of a receiving logic input. In other words, the ground bounce can be interpreted as a switched signal on an input that isn't being switched.

The ground bounce limit is set according to the most sensitive input driven by the switching device. Given a ground bounce limit, the number of SSOs ("drivers") allowed on a power/ground pair is set according to several assumptions. Manufacturers print tables of SSO guidelines for various types of logic, drivers, and packages. The SSO guidelines assume various values for parameters that affect ground bounce voltage.

Table 1, which is merely exemplary, is a table of the maximum number of SSOs per power/ground pair published by XILINX, INC. of San Jose, Calif. for using a VIRTEX™ FPGA in a digital switching system. The first column refers to the logic standard, such as whether the receiving logic is low-voltage complimentary metal-oxide-semiconductor, second generation ("LVCMOS2") or low-voltage transistor—transistor logic ("LVTTL"), which can have a fast slew rate or a slow slew rate. The recommended maximum number of SSOs depends on many factors, such as how much current is drawn by the loads, the total input capacitance of the loads being driven, and the type of package the FPGA will be housed in, such as a ball grid array ("BGA") package, a high-heat dissipation quad flat package ("HQ"), or a plastic quad flat package ("PQ"). For example, in the first row of Table 1 the number "10" relates to the "Package Type" "BGA" and indicates that no more than 10 LVCMOS2-type SSOs are recommended for the FPGA when it is in a BGA package. Similarly, the number "7" relates to the "Package Type" "HQ" and indicates that no more than 7 LVCMOS2-type SSOs are recommended for the FPGA when it is in a HQ package. And the number "5" relates to the "Package Type" "PQ" and indicates that no more than 7 LVCMOS2-type SSOs are recommended for the FPGA when it is in a PQ package.

TABLE 1

Maximum Number of Recommended Simultaneous Switching Outputs

| | Receiving Logic Standard Package Type | | |
|---|---|---|---|
| | BGA | HQ | PQ |
| LVCMOS2 | 10 | 7 | 5 |
| LVTTL, Fast Slew Rate, 8 mA drive | 13 | 10 | 7 |
| LVTTL, Fast Slew Rate, 12 mA drive | 10 | 7 | 5 |
| LVTTL, Fast Slew Rate, 24 mA drive | 5 | 4 | 3 |
| LVTTL, Slow Slew Rate, 8 mA drive | 22 | 17 | 12 |
| LVTTL, Slow Slew Rate, 12 mA drive | 17 | 12 | 9 |
| LVTTL, Slow Slew Rate, 24 mA drive | 9 | 7 | 5 |

Table 1 is a small subset of the type of SSO guideline tables typically published by a device manufacturer for use as an engineering design tool. Such tables often include many more types of receiving logic standards, package types, and loads. The drivers in the FPGA are configurable, and are selectively programmed to provide the proper drive characteristics for the intended receiving logic. Typical SSO guideline tables frequently include several hundred entries.

A design engineer using Table 1 would see that a power/ground pair of the FPGA could accommodate 13 8 mA LVTTL fast-slew loads when the FPGA is in a BGA package, or 22 8 mA LVTTL slow-slew loads. Fewer SSOs are recommended as the slew rate increases, and fewer SSOs are recommended as the driver current increases; however, these are merely general trends.

The SSO design tables are generated using circuit-simulation software. A circuit model of the switching device, receiving logic, package, and PWB is created. A simulator is used to iteratively determine how many SSOs may be driven before a specified noise voltage limit is exceeded. The parameters are varied one-by-one to obtain the table entries. The process of generating a complete SSO guideline table is long and tedious. To complicate matters, several values that affect the SSO guidelines are assumed during the simulation, such as the inductance of vias in a PWB, or of a trace in a package. Packing and PWBs continue to change, which changes the actual inductance from that which was assumed when generating the SSO guideline table. Similarly, the maximum allowable ground bounce voltage is not the same for all receiving logic, and new types of receiving logic may have a lower ground bounce voltage specification.

For example, LVTTL-type drivers can have as much as 800 mV of ground bounce noise before tripping an input-low threshold. Digital switching devices having an assumed ground bounce specification of ±600 mV when used with a PWB having an inductance to ground of 1 nH should work with the LVTTL driver if the SSO guidelines (which assumed a 1 nH board-level inductance) are followed. However, advances in PWB manufacturing have increased actual board-level inductance to 2–3 nH, and actual ground bounce voltage for the digital switching device might exceed the 800 mV threshold of the LVTTL-type driver when used on a newer PWB. Similarly, as the supply voltage level of logic devices decreases, components generally tolerate less ground bounce noise. Some new receiving logic devices tolerate as little as 400 mV undershoot at the input, and might not operate correctly if a SSO guideline table assuming a maximum of ±600 mV was used to design the interface between the switching device (e.g. FPGA) and the receiving logic.

It is desirable to provide guidance for managing ground bounce at the package level for a digital switching device without having to re-establish and re-publish SSO guideline tables. It is further desirable to provide flexibility in determining the maximum number of SSOs to account for different types of output drivers on a single I/O bank of a digital switching device. It is also desirable to be able to analyze ground bounce voltage for an entire digital switching device.

SUMMARY OF THE INVENTION

The present invention enables techniques for evaluating ground bounce noise in a digital switching system. In one embodiment, scaling factors are used to determine a simultaneous switching output ("SSO") allowance for a digital switching device. A first scaling factor is calculated from a first expected parameter value of a digital system and a first assumed parameter value used to generate a SSO guideline for the digital switching device. The SSO guideline is an entry in a SSO guideline table, for example. In a further embodiment, additional scaling factors are calculated from additional expected and assumed parameters, and the scaling factors are multiplied together to obtain the SSO allowance.

In a particular embodiment, three scaling factors are used. The first scaling factor accounts for the difference between the assumed PWB inductance and the expected PWB inductance. The second scaling factor accounts for the difference between the assumed maximum ground bounce voltage and the maximum ground bounce voltage that is specified for the receiving logic. The third scaling factor accounts for differences between the assumed load capacitance and the expected load capacitance.

In one embodiment, an SSO guideline (table entry) is multiplied by the SSO allowance and the integer portion of the product is taken to obtain a scaled SSO guideline.

In another embodiment, weighted average SSOs ("WASSOs") are calculated for adjacent I/O banks of the digital switching device. Ground bounce voltage performance of the adjacent I/O banks is evaluated by comparing the average WASSO for the adjacent I/O banks against the SSO allowance. If the average WASSO exceeds a selected amount, techniques are applied to reduce ground bounce in the digital system. In one embodiment, the selected amount is the SSO allowance. In an alternative embodiment, the selected amount is the SSO allowance multiplied by a factor slightly greater than 1, such as about 1.05.

In yet another embodiment, WASSOs are determined for all I/O banks of the digital switching device, such as a packaged FPGA. The ground bounce voltage performance of the digital switching device is evaluated by comparing the average WASSO for all I/O banks against the SSO allowance. If the average WASSO exceeds the SSO allowance, techniques are applied to reduce ground bounce in the digital system.

BRIEF DESCRIPTION OF THE DRAWINGS

FIG. 5A is a flow chart of a method of evaluating ground bounce voltage for adjacent I/O banks.

FIG. 5B is a flow chart of a method of evaluating ground bounce voltage for a digital switching device.

FIG. 6 is an exemplary spread-sheet according to an embodiment of the present invention.

DETAILED DESCRIPTION OF THE DRAWINGS

The present invention introduces new concepts for managing ground bounce noise generated by SSOs in a digital switching system. One concept is called SSO allowance, which accounts for PWB parasitics (such as inductances based on thickness, via diameter, break-out trace width and length, pad, and plane), socket inductance, input logic-low threshold, input undershoot voltage, input parasitic capacitance, and output fan-out. The SSO allowance enables obtaining a scaled SSO guideline that accounts for design-specific parameters that are not reflected in published SSO tables.

In one embodiment, a WASSO is computed for a number of different drivers in an input/output ("I/O") bank of a digital switching device to normalize driver types and analyze the I/O bank for ground bounce performance. In another embodiment, an average WASSO is calculated for adjacent I/O banks and compared against the SSO allowance to evaluate the ground bounce noise performance of the adjacent I/O banks. In a further embodiment, an average WASSO is calculated for an entire digital switching device, such as a packaged FPGA, and compared against the SSO allowance to evaluate the ground bounce noise performance of the entire digital switching device.

Figure 1:
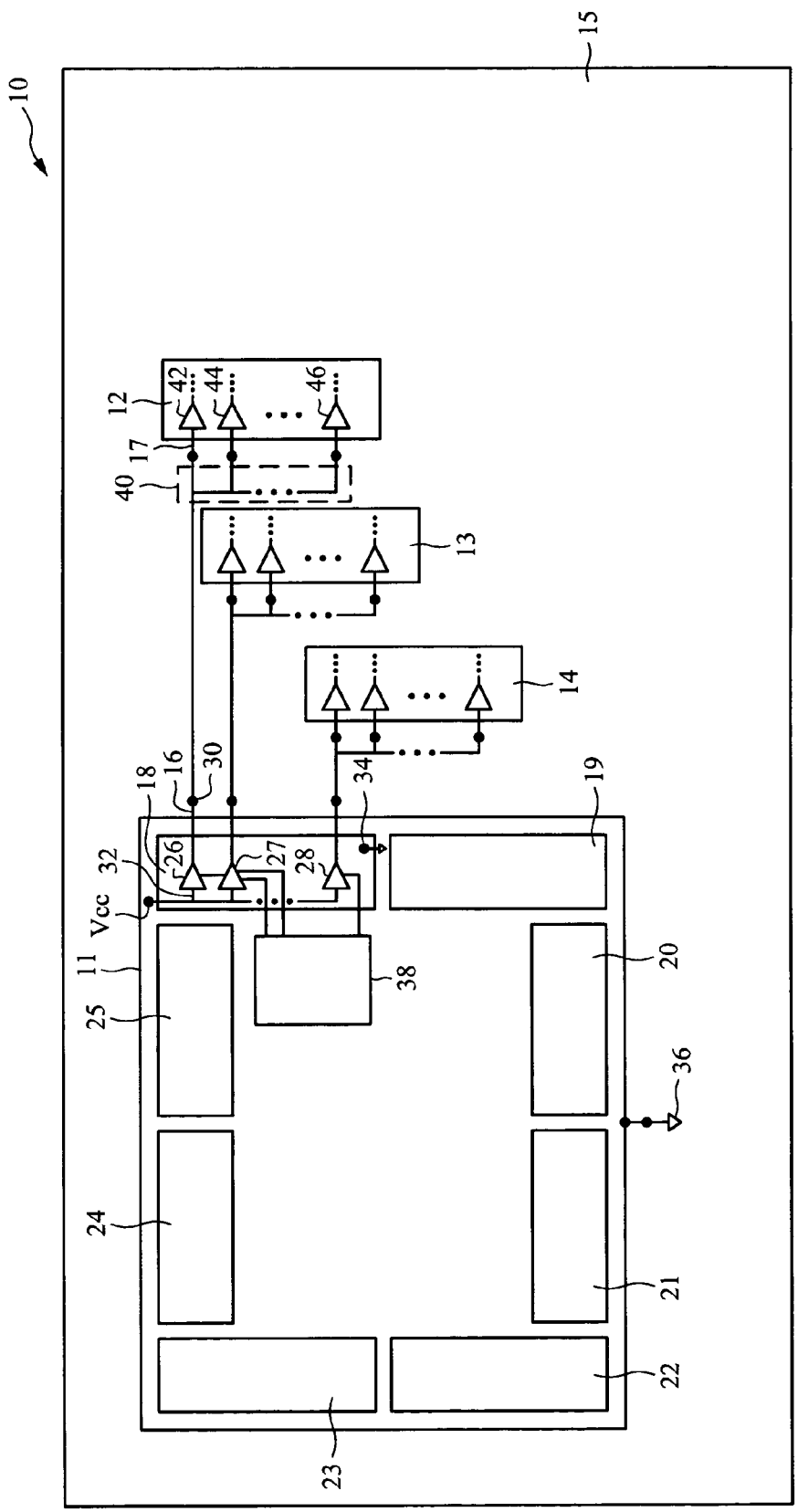
FIG. 1 is a simplified diagram of a digital system 10 according to an embodiment of the present invention.

FIG. 1 is a simplified diagram of a digital system 10 according to an embodiment of the present invention. A digital switching device 11, such as a FPGA or other semiconductor IC, is coupled to receiving logic devices 12, 13, 14 ("receiving logic") through a PWB 15. The PWB has vias and traces that create inductance between a power output 16 of the digital switching device 11 and inputs 17 of the receiving logic device 12.

Power ($V_{cc}$) is supplied to I/O blocks 18, 19, 20, 21, 22, 23, 24, 25, which distribute the power to drivers 26, 27, 28 within the I/O block 18. Only some of the drivers in only one I/O block are shown for simplicity of illustration. In some digital switching devices, such as FPGAs, the drivers 26, 27, 28 are configurable, providing a selectable output voltage ($V_{cco}$) on the power output pin 30 according to the type of receiving logic device. The power input 32 to the driver 26 forms a power/ground pair with the ground 34 of the digital switching device 11, which is coupled to the PWB ground 36 through conductive traces and vias (not shown) of the digital switching device. Internal logic 38 configures the driver 26 for a selected type of load and controls the state of the driver(i.e. switches the driver between a logical 1 and a logical 0).

The driver 26 supplies a switching signal (i.e. a logical 1 or a logical 0) to a buss (shown in a dashed line) 40 on the PWB 15 that couples the switching signal to loads 42, 44, 46 of the receiving logic device 12. Thus, the loads of the receiving logic device switch simultaneously. Alternatively, the buss distributes the switching signal to additional receiving logic devices.

A FPGA typically supports 5 or more different types of driver configurations. This allows the user great flexibility in using the FPGA in a digital system. As discussed above in relation to Table 1, different types of receiving logic devices may operate according to different logic standards (i.e. provide different types of loads). Some types of receiving logic devices and PWBs may not be represented in a published SSO guideline table. For example, the PWB 15 may have a different total inductance, or the receiving logic device 12 may have a lower ground bounce noise limit than was assumed to calculate the values in the SSO guideline table. Using the entries published in the SSO guideline table in these circumstances could result in erroneous operation of the digital system 10.

The concept of SSO allowance is based on the observation that ground bounce voltage scales linearly with elements (e.g. resistors, capacitors, and inductors) in the circuit simulations used to generate SSO guideline tables. SSO allowance enables adapting published SSO guidelines for evaluating digital systems that are not represented in the SSO guideline tables, thus avoiding the need to re-publish and/or expand SSO guideline tables for new types of receiving logic, PWBS, and packaging. SSO allowance takes into account design-specific parameters, such as board-level inductance, input logic-low threshold, input undershoot voltage, and output load capacitance, and can take into account other parameters, such as board-level capacitance and resistance. SSO allowance is a very useful tool for digital circuit designers desiring to use digital switching devices and/or PWBS that are not represented in published SSO guideline tables.

SSO allowance is a number ranging from 0% to 100% and in one example is a product of three scaling factors. The first scaling factor is determined by dividing the assumed inductance of the PWB (used to generate a SSO guideline table) by the actual inductance of the PWB 15. For example, if an assumed PWB inductance of 1.0 nH was used to generate the SSO guideline table and the PWB 15 has an actual inductance of 1.1 nH, than the first scaling factor is 1.0/1.1×100%, or 90.9%. All of the numbers provided in the discussions of embodiments of the invention are merely exemplary, are provided only for convenience of discussion, and do not limit the invention.

The second scaling factor is determined by dividing the lesser of actual input undershoot voltage and actual input logic low threshold by the assumed ground bounce voltage limit that was used to establish the SSO guideline table. For example, if the assumed ground bounce voltage limit was 600 mV, and the intended receiving logic device 12 has an actual input undershoot voltage or input logic low threshold of 550 mV, the second scaling factor is 550/600×100%, or 91.7%.

The third scaling factor is determined by dividing the ground bounce voltage limit for the load capacitance for the capacitive loading used to establish the SSO guideline table by the ground bounce voltage expected for loads having a greater load capacitance. In a particular example, an output driver produces an additional 9 mV of ground bounce voltage for each additional 1 pF of load capacitance. If the assumed ground bounce voltage limit used to establish the SSO guideline table was 600 mV for a 15 pF load capacitance, and the actual load capacitance is 22 pF, the third scaling factor is (600 mV)/(((22 pF−15 pF)×9 mV/pF)+600 mV)=600 mV/663 mV×100%, or 90.5%. Thus the SSO allowance in this example is 90.9%×91.7%×90.5%, or 75.4% (i.e. 75.4% of the SSO guideline published in the table).

Other scaling factors and additional scaling factors can be used in other embodiments. For example, PWB capacitance and resistance can be incorporated into a SSO allowance. SSO allowance enables scaling a published SSO guideline when designing a digital system not represented in the SSO guideline table, evaluating ground bounce performance for adjacent I/O banks, and evaluating ground bounce performance for an entire digital switching device, such as a packaged FPGA or other semiconductor IC.

WASSO is another concept for evaluating ground bounce performance. WASSO allows a designer to normalize output drivers 26, 27, 28 within an I/O bank 18 when the output drivers have different drive requirements. For example, if a digital switching device 11 is required to drive forty-three fast LVTTL 24 mA loads, thirty fast LVTTL 12 mA loads, and twenty-two slow LVTTL 8 mA loads; and there are 13 power/ground pairs in an I/O bank, a WASSO for the I/O bank is calculated as follows.

Referring to Table 1, each power/ground pair can be configured to drive five LVTTL Fast 24 mA loads. With 13 power ground pairs, the I/O bank could drive a maximum of 13×5=65 LVTTL Fast 24 mA loads. Since drivers for only forty-three such loads are required by the digital system, these drivers utilize 43/65×100%=66.2% of the I/O bank resource (66.2% I/O bank utilization).

For the thirty LVTTL Fast 12 mA loads, each power/ground pair can drive ten loads, for a total of 13×10=130 fast 12 mA loads for the I/O bank. Only thirty such drivers are required for the digital system, so these drivers utilize 30/130×100%=23.1% of the I/O bank resource.

For the twenty-two LVTTL Slow 8 mA loads, each power/ground pair can drive twenty-two loads, for a total of 22×13=286 slow 8 mA drivers for the I/O bank. These drivers utilize only 22/286×100%=7.7% of the I/O bank resource.

The WASSO for the I/O bank 18 ("I/O bank 0") in the above example is the sum of the utilizations for each type of driver, or 66.2%+23.1%+7.7%=97%. The WASSO for the I/O bank 18 does not exceed 100%, and the digital system 10 should operate without excessive ground bounce.

However, digital switching devices typically have several I/O banks. Digital designers often cluster wide buses at one edge of the digital switching device 11 for ease of routing traces on the PWB 15 and de-bugging of the digital system 10. This causes uneven current distribution, exacerbating ground bounce voltage within the digital switching device 11. Generally, it is desirable to avoid exceeding the SSO allowance for adjacent I/O banks; however, the SSO allowance is exceeded in some embodiments as long as it does not create excessive ground bounce voltage.

A conventional SSO guideline table specifies how many switching outputs of a particular driver type could be used per power/ground pair. The tables do not account for, or provide the ability to, analyze SSO for adjacent I/O banks or for the entire digital switching device. An embodiment of the present invention enables accounting for the effect adjacent I/O banks have on the ground bounce voltage. Analyzing SSO for adjacent I/O banks allows a designer to appropriately distribute wide buses and/or high-current loads on the PWB 15 to avoid uneven current distribution.

For example, to evaluate adjacent I/O banks, calculate the WASSO for I/O bank 19 (ref. FIG. 1), which is adjacent to the I/O bank 18. If the WASSO for I/O bank 19 is 45%, the average WASSO for the two adjacent I/O banks 18, 19 is (97%+45%)/2=71%. In this case, the average WASSO is less than the SSO allowance of 75.4% calculated in the example above and the design avoids excessive ground bounce voltage. In some embodiments, the designer should apply ground bounce voltage reduction techniques to one or both of the I/O banks in question if the average WASSO of two adjacent I/O banks exceeds the SSO allowance. In other embodiments, a slightly higher value of average WASSO is acceptable.

Similarly, an embodiment of the invention enables analyzing SSO for the entire digital switching device 11. If the digital switching device has eight I/O banks 18, 19, 20, 21, 22, 23, 24, 25 the WASSO is calculated for each I/O bank. For example, assume 97%, 45%, 50%, 60%, 60%, 35%, 40%, and 15% are the WASSOs for the eight I/O banks shown in FIG. 1. The designer should first ensure that no single WASSO exceeds 100%. If the WASSO for an I/O bank exceeds 100%, the designer should apply ground bounce reduction techniques to that I/O bank.

The WASSO for the digital switching device 11 ("device WASSO") is the sum of the WASSOs of all the I/O banks divided by the number of I/O banks, or (97%+45%+50%+60%+60%+35%+40%+15%)/8=50.3%, which is less than the SSO allowance of 75.4%, and indicates the design is acceptable to avoid excessive ground bounce voltage. If the device WASSO exceeds the SSO allowance, the designer should apply ground bounce reduction techniques to reduce the device WASSO.

Figures 2, 3:
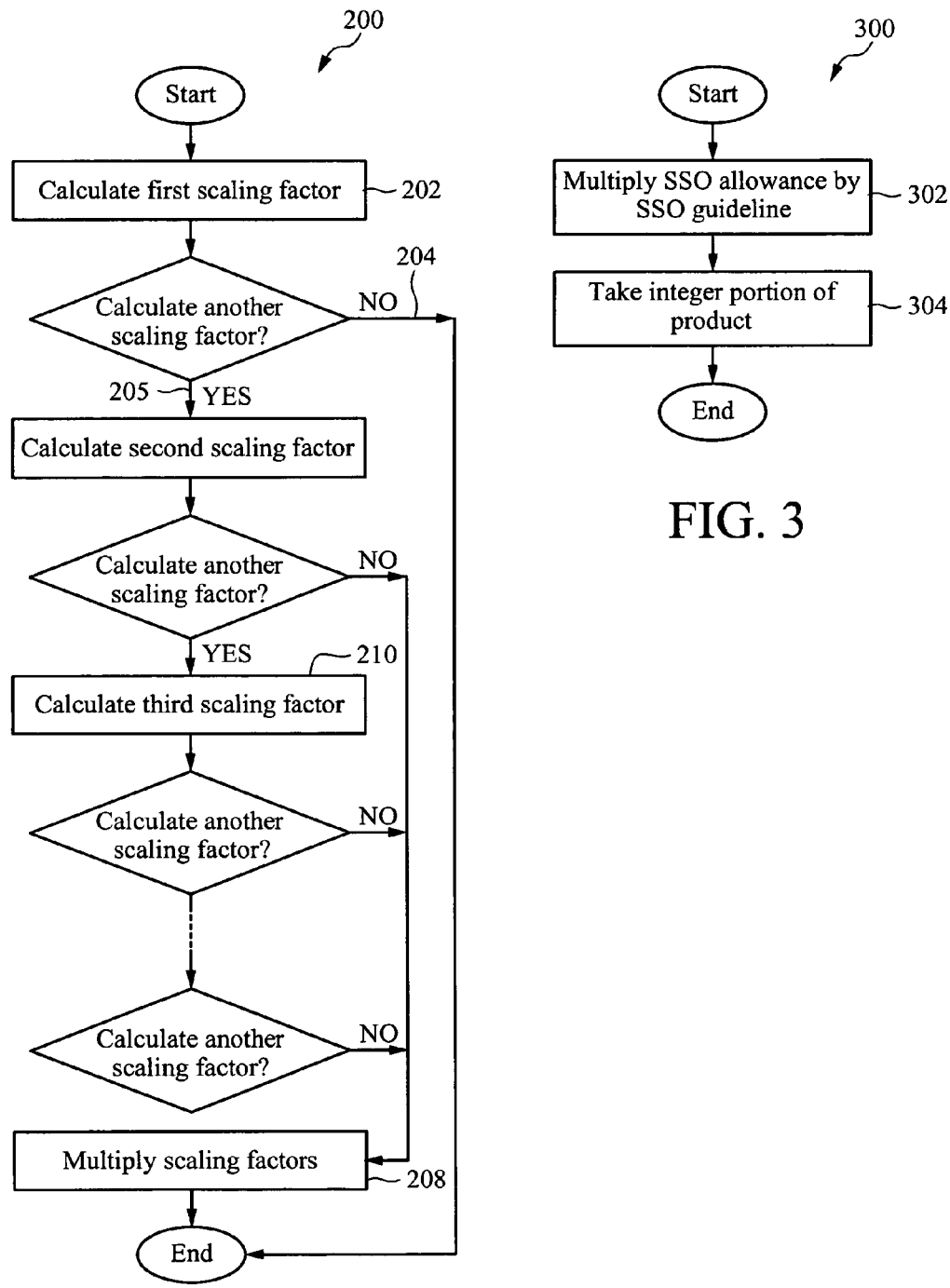
FIG. 2 is a simplified flow chart of a method for calculating SSO allowance according to an embodiment of the present invention.
FIG. 3 is a flow chart of a method for adapting a SSO guideline for use in designing a digital system.

FIG. 2 is a simplified flow chart 200 of a method for calculating SSO allowance according to an embodiment of the present invention. A first scaling factor is calculated (step 202) from an assumed parameter value used to generate a SSO guideline and an expected parameter value of a digital system. The scaling factor accounts for one or more effects of board parasitics, IC socket parasitics, load capacitance, output fan-out, or other design-related effect(s) not accounted for in the SSO guideline. For example, the first scaling factor is calculated by dividing an assumed PWB board inductance by an expected PWB board inductance. If only a single scaling factor is used (branch 204), the scaling factor is the SSO allowance. The SSO allowance is used to obtain a scaled SSO guideline by multiplying the SSO guideline by the SSO allowance, or to evaluate WASSO for adjacent I/O banks for a digital switching device.

If another scaling factor is used to calculate the SSO allowance (branch 205), a second scaling factor is calculated (step 206) from a second assumed parameter value used to generate the SSO guideline and a second expected parameter value of the digital system. For example, the second scaling factor is calculated by dividing the lesser of an expected input undershoot voltage and an input logic low threshold by the ground bounce voltage assumed to generate the SSO guideline. The scaling factors are multiplied (step 208) to obtain the SSO allowance.

In a yet further embodiment, a third scaling factor is calculated (step 210) from third and fourth assumed parameter values used to generate the SSO guideline and a third expected parameter value of the digital system. For example, the third scaling factor is calculated by dividing the assumed maximum ground bounce voltage for an assumed load capacitance by the expected voltage generated by an expected load capacitance. The SSO allowance is calculated by multiplying the scaling factors together (step 208). Alternatively, additional scaling factors are calculated, with the SSO allowance being the product of the scaling factors. The order in which the scaling factors are calculated in does not matter.

FIG. 3 is a flow chart 300 of a method for adapting a SSO guideline for use in designing a digital system. The SSO guideline is multiplied (step 302) by a SSO allowance (see FIG. 2). The integer portion of the product of step 302 is taken (step 304) to produce a scaled table entry. For example, if the SSO guideline recommends a maximum of five loads from a power/ground pair when driving fast 24 mA LVTTL loads, and the SSO allowance is 0.754, the product is 3.77, and the scaled table entry is 3.

Figure 4:
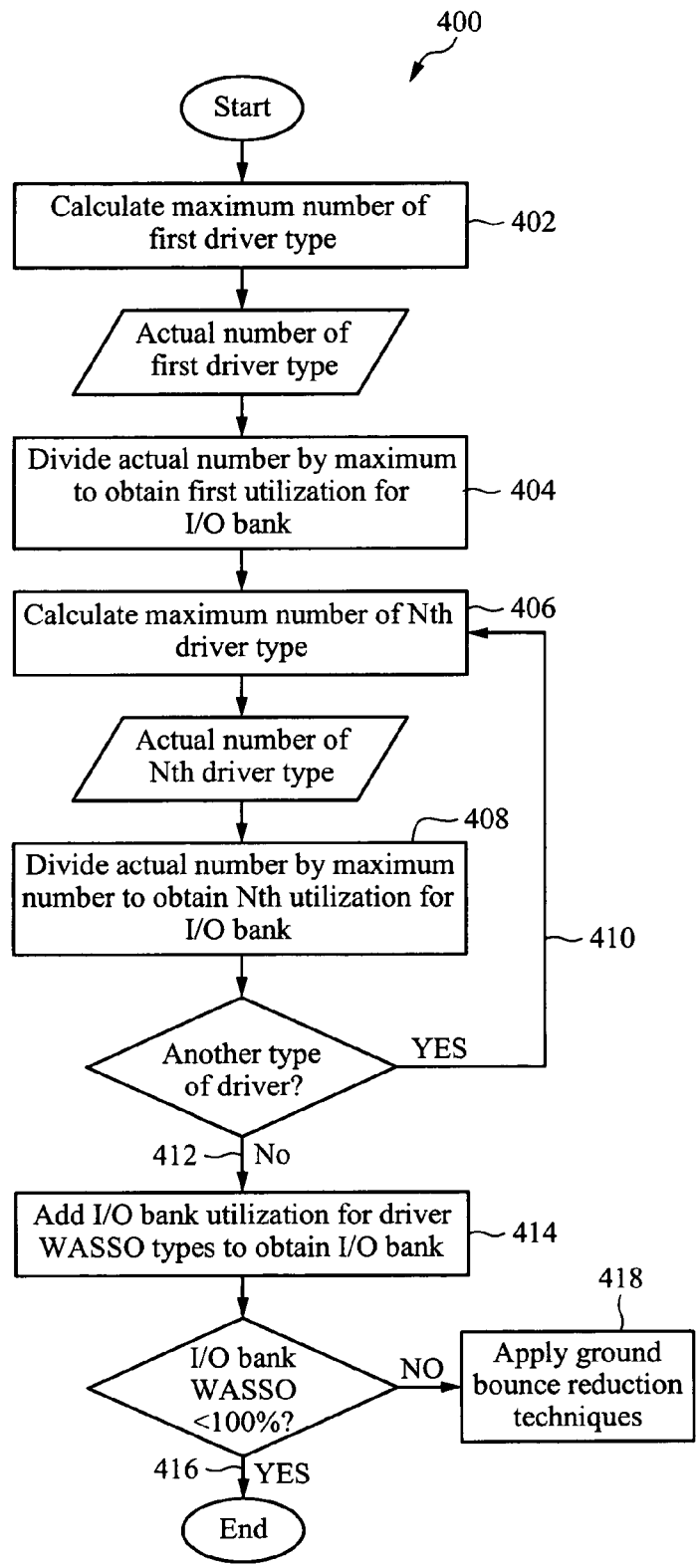
FIG. 4 is a flow chart of a method of calculating WASSO for an I/O bank.

FIG. 4 is a flow chart 400 of a method of calculating WASSO for an I/O bank. A maximum number of a first driver type is calculated (step 402) for the I/O bank. An actual number of the first driver type is divided (step 404) by the maximum number of the first driver type to obtain a first I/O bank utilization.

A maximum number of a second driver type (i.e., N=2) is calculated (step 406) for the I/O bank. An actual number of the second driver type is divided (step 408) by the maximum number of the second driver type to obtain a second (i.e., N=2) I/O bank utilization. The steps of calculating I/O bank utilizations continues (path 410) incrementing N=N+1, until all types of drivers have been handled. If no more drivers are on the I/O bank (branch 412), the I/O bank utilizations are added (step 414). If the I/O bank WASSO utilization is less than 100%, the design is acceptable (branch 416). If the I/O bank WASSO utilization exceeds 100%, apply ground bounce reduction techniques (step 418), typically by reducing the numbers of drivers, if desired. Determining the WASSO for an I/O bank allows the circuit designer to evaluate the ground bounce performance of an I/O bank by homologating the various loads driven by the I/O bank.

FIG. 5A is a flow chart 500 of a method of evaluating ground bounce voltage for adjacent I/O banks. A first WASSO is calculated (step 502) for a first I/O bank. A second WASSO is calculated (step 504) for a second I/O bank that is adjacent to the first I/O bank along an edge of a digital switching device. The first and second WASSOs are added together (step 506) and divided by two (step 508) to obtain an average WASSO. The average WASSO is compared (step 510) against a device SSO allowance, and, if the average WASSO exceeds the device SSO allowance, ground bounce reduction techniques are applied (step 512) to one or both of the I/O banks. If the average WASSO is less than the SSO allowance, the design is acceptable (step 514).

In an alternative embodiment, the device SSO allowance is multiplied by a factor greater than 1, such as 1.05. In other words, the average 2-bank WASSO can be greater than the device SSO allowance; however, the WASSO for each bank must be below 100% of the device WASSO allowance. The factor is chosen in light of the current spreading out over the adjacent banks in the packaged device, but is kept sufficiently small to avoid excessive localized ground bounce.

FIG. 5B is a flow chart 520 of a method of evaluating ground bounce voltage for a digital switching device. WASSOs are calculated for each I/O bank of the digital switching circuit (step 522). The WASSOs are summed (step 524) and divided (step 526) by the number of I/O banks to obtain a device WASSO. The device WASSO is compared against the SSO allowance (step 528), and, if the device WASSO exceeds the SSO allowance, ground bounce reduction techniques are applied (step 530) to one or more of the I/O banks. If the device WASSO is less than the SSO allowance (branch 532), then the design is acceptable.

Some embodiments of the invention are implemented in computer software and stored on computer readable media, such as disk drives, magnetic diskettes, read-only memories ("ROMs") and optical ROMs. The software configures a general purpose computer system into an apparatus for performing a method(s) according to embodiments of the invention. In a particular embodiment, a type of computer program commonly known as a "spread sheet" is configured to operate as a WASSO calculator. Using a spread sheet format provides the user with a convenient and familiar interface for entering the required information and evaluating the results.

Figure 6:
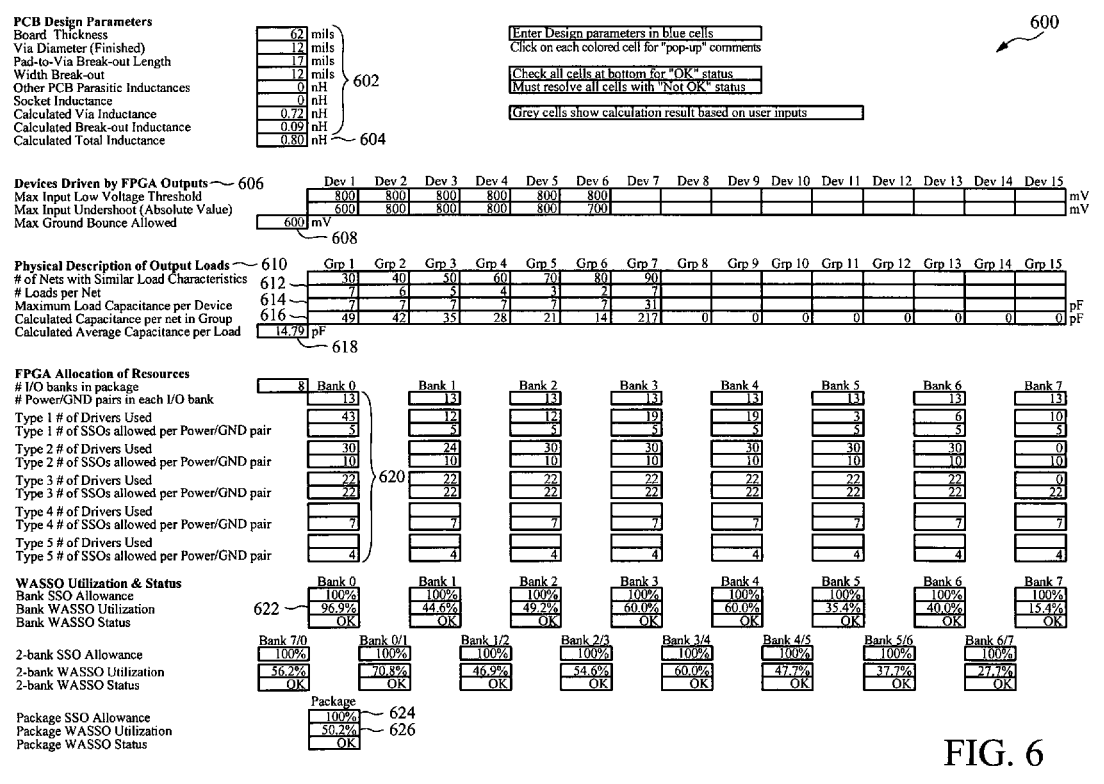

FIG. 6 is a spread-sheet 600 according to an embodiment of the present invention. A spread sheet offers a convenient way to implement methods of the present invention. Information entered into fields of the spread sheet 600 is merely exemplary for convenience of discussion. PCB design parameters 602 are entered and the Calculated Total inductance 604 is calculated using well-known models and techniques. Relevant specifications of receiving logic devices 606 are entered, and the Max Ground Bounce Allowed 608 (which in this example is the lowest entry) is determined.

Physical Descriptions of Output Loads 610 are entered. The number of loads per net 612 is multiplied by the maximum load capacitance per group 614 to calculate the total capacitance per group 616. The series combination of these group capacitances determines the Calculated Average Capacitance per Load 618.

The Calculated Total Inductance, Maximum Ground Bounce Allowed, and Calculated Average Capacitance per load are useful in generating scaling factors when calculating a SSO allowance. Other WASSO calculators use different, additional, or fewer parameters.

Data for the FPGA Allocation of Resources 620 is entered. The WASSO calculator is adaptable to a wide range of devices, I/O banks, and types of drivers. The drivers used and maximum number of recommended drivers are entered, as is discussed above in relation to calculating WASSO for a single I/O bank. The spread sheet calculates the WASSO for each I/O bank, displayed as the Bank WASSO Utilization 622, and checks each I/O bank to ensure none exceed 100% utilization.

The WASSO calculator then checks each pair of adjacent I/O banks (see FIG. 1 ref. nums. 18–25 for examples of adjacent pairs of I/O banks) to ensure the two-bank average is less than the SSO allowance 624. Finally, the device WASSO 626 for the packaged FPGA is calculated and compared against the SSO allowance 624 to ensure that the device WASSO 626 does not exceed the SSO allowance 624.

In the foregoing specification, the invention has been described with reference to specific exemplary embodiments thereof. Other embodiments will be apparent to those of ordinary skill in the art. For example, the digital switching device may have fixed driver outputs, or more or fewer I/O banks. Similarly, although embodiments of the invention have been described using a FPGA as an example, embodiments of the invention are alternatively implemented in other types of semiconductor IC's, either with or without configurable drivers. Thus, it is evident that various modifications and changes may be made thereunto without departing from the broader spirit and scope of the invention as set forth in the appended claims and their full scope of equivalents.

The invention claimed is:

1. A method of determining a simultaneous switching output ("SSO") allowance for a digital switching device comprising:
   calculating a first scaling factor from a first expected parameter value of a digital system and a first assumed parameter value used to generate a SSO guideline for the digital switching device.

2. The method of claim 1 further comprising steps of multiplying the SSO guideline by the first scaling factor to obtain a product; and
   taking the integer portion of the product to obtain a scaled SSO guideline.

3. The method of claim 1 further comprising steps of:
   calculating a second scaling factor from a second expected parameter value of the digital system and a second assumed parameter value used to generate the SSO guideline; and
   multiplying the first scaling factor and the second scaling factor to obtain the SSO allowance.

4. The method of claim 3 further comprising a step of calculating a third scaling factor from a third expected parameter value of the digital system and at least a third assumed parameter value used to generate the SSO guideline, wherein the multiplying step further includes multiplying the third scaling factor with the first scaling factor and the second scaling factor to obtain the SSO allowance.

5. The method of claim 4 wherein the third scaling factor is calculated from the third assumed parameter value and from a fourth assumed parameter value used to generate the SSO guideline.

6. The method of claim 4 wherein the fourth assumed parameter value is one of the first assumed parameter value or the second assumed parameter value.

7. The method of claim 1 wherein the first assumed parameter value is selected from the group consisting of a printed wiring board inductance, a maximum ground bounce voltage, and a load capacitance.

8. The method of claim 4 wherein the step of calculating the first scaling factor comprises dividing an assumed printed wiring board inductance by an expected printed wiring board inductance,
   the step of calculating the second scaling factor comprises dividing an expected maximum ground bounce voltage by an assumed maximum ground bounce voltage; and
   the step of calculating the third scaling factor comprises dividing the assumed maximum ground bounce voltage by the assumed maximum ground bounce voltage added to a ground bounce voltage calculated from a difference between an expected load capacitance and an assumed load capacitance, the difference being multiplied by a voltage-per-capacitance.

9. The method of claim 1 further comprising steps of:
   calculating a first maximum number of a first driver type for an I/O bank;
   dividing a first actual number of the first driver type by the first maximum number to obtain a first I/O bank utilization;
   calculating a second maximum number of a second driver type for the I/O bank;
   dividing a second actual number of the second driver type by the second maximum number to obtain a second I/O bank utilization;
   adding the first I/O bank utilization to the second I/O bank utilization to obtain a weighted average simultaneous switching output ("WASSO") for the I/O bank; and comparing the WASSO against the SSO allowance.

10. The method of claim 9 further comprising steps of
calculating a third maximum number of a third driver type for the I/O bank; and
dividing a third actual number of the third driver type by the third maximum number to obtain a third I/O bank utilization, wherein the step of adding includes adding the third I/O bank utilization to the first I/O bank utilization and to the second I/O bank utilization to obtain the WASSO for the I/O bank.

11. The method of claim 9 further comprising steps of
calculating a third maximum number of a third driver type for an adjacent I/O bank;
dividing a third actual number of the third driver type by the third maximum number to obtain a first adjacent I/O bank utilization;
calculating a fourth maximum number of a fourth driver type for the adjacent I/O bank;
dividing a fourth actual number of the fourth driver type by the fourth maximum number to obtain a second adjacent I/O bank utilization;
adding the third I/O bank utilization to the fourth I/O bank utilization to obtain a second WASSO for the adjacent I/O bank;
adding the WASSO and the second WASSO to obtain a WASSO sum;
dividing the WASSO sum by two to obtain an average WASSO; and
comparing the average WASSO against the SSO allowance.

12. The method of claim 1, wherein the digital switching device has N I/O banks, N being an integer, further comprising steps of
calculating a weighted average simultaneous switching outputs ("WASSO") for each of the N I/O banks to obtain N WASSOs;
adding the N WASSOs to obtain a WASSO sum;
dividing the WASSO sum to obtain a device WASSO; and
comparing the device WASSO against the SSO allowance.

13. The method of claim 1 wherein the digital switching device is a field-programmable gate array ("FPGA").

14. The method of claim 9 wherein the first driver type is configurable.

15. A computer-readable medium having computer-executable instructions for performing the method of claim 1.

16. A digital switching system comprising:
a digital switching device having N I/O banks, where N is an integer, including a first I/O bank capable of driving a first maximum number of a first type of load and a second maximum number of a second type of load; and
receiving logic having a first number of inputs of the first type of load coupled to the first I/O bank and a second number of inputs of the second type of load coupled to the first I/O bank, wherein a first portion of a first I/O bank utilization is the first number divided by the first maximum number times 100%, a second portion of the first I/O bank utilization is the second number divided by the second maximum number times 100%, a first weighted average simultaneous switching output ("WASSO") of the first I/O bank being the first portion of the I/O bank utilization summed with the second portion of the I/O bank utilization, the first WASSO being less than 100%.

17. The digital switching system of claim 16 wherein the digital switching device is a field-programmable gate array ("FPGA") and the first I/O bank includes configurable drivers.

18. The digital switching system of claim 16 further comprising:
a second I/O bank adjacent to the first I/O bank capable of driving a third maximum number of a third type of load and a fourth maximum number of a fourth type of load; and
second receiving logic having a third number of the third type of load coupled to the second I/O bank and a fourth number of the fourth type of load coupled to the second I/O bank, wherein a first portion of the second I/O bank utilization is the third number divided by the third maximum number times 100%, a second portion of the second I/O bank utilization is the fourth number divided by the fourth maximum number times 100%, the first portion of the second I/O bank utilization being summed with the second portion of the second I/O bank utilization to obtain a second WASSO, the second WASSO being less than 100% and an average of the first WASSO and the second WASSO being less than a simultaneous switching output allowance.

19. The digital switching system of claim 18 where the third type of load is the same as the first type of load and the fourth type of load is the same as the second type of load.

20. The digital switching system of claim 16 wherein the N I/O banks are connected to receiving logic a plurality of loads having numbers and types of loads selected to provide N WASSOs for the N I/O banks wherein each of the N WASSOs is less than 100% and a sum of the N WASSOs is less than a simultaneous switching output allowance.

21. A system of evaluating a digital switching system for ground bounce voltage comprising:
means for calculating a simultaneous switching output ("SSO") allowance;
means for calculating a first weighted average simultaneous switching allowance ("WASSO") for a first I/O bank of a digital switching device in the digital switching system;
means for calculating a second WASSO for a second I/O bank of the digital switching device;
means for averaging the first WASSO and the second WASSO to obtain an averaged WASSO; and
means for determining whether to apply ground bounce voltage reduction techniques to the digital switching system.

22. In a computer system having a user interface including a display and a selection device, a method of entering data and viewing results from the display comprising:
generating a spread sheet having entry cells and at least one calculation cell on the display;
entering printed circuit board design parameters into a first set of entry fields;
entering specifications of receiving logic in a second set of entry fields;
entering physical descriptions of output loads in a third set of entry fields;
entering a number of drivers used and a maximum number of recommended drivers for a plurality of driver types in an input-output bank of a digital switching device; and
displaying a weighted average simultaneous switching utilization for the input-output bank in a first calculation cell.

* * * * *